(12) United States Patent
Caneau et al.

(10) Patent No.: US 7,072,376 B2
(45) Date of Patent: Jul. 4, 2006

(54) METHOD OF MANUFACTURING AN INP BASED VERTICAL CAVITY SURFACE EMITTING LASER AND DEVICE PRODUCED THEREFROM

(75) Inventors: Catherine G Caneau, Painted Post, NY (US); Benjamin L Hall, Corning, NY (US); Nobuhiko Nishiyama, Painted Post, NY (US); Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 92 days.

(21) Appl. No.: 10/944,649

(22) Filed: Sep. 16, 2004

(65) Prior Publication Data

US 2006/0056475 A1    Mar. 16, 2006

(51) Int. Cl.
*H01S 3/08*    (2006.01)
*H01S 5/00*    (2006.01)

(52) U.S. Cl. ............... 372/99; 372/50.1; 372/50.11
(58) Field of Classification Search ............ 372/99, 372/50.1, 50.11
See application file for complete search history.

(56) References Cited

U.S. PATENT DOCUMENTS

| | | | |
|---|---|---|---|
| 6,717,974 B1 | 4/2004 | Zhang | 372/96 |
| 6,720,583 B1 | 4/2004 | Nunoue et al. | 257/98 |
| 6,933,539 B1 * | 8/2005 | Bhat et al. | 257/104 |

OTHER PUBLICATIONS

Nishiyama et al. "Long Wavelength VCSELs on InP grown by MOCVD", Corning Inc., Corning, NY 14831, USA. n.d.

Nishiyama, et al. "High efficiency long wavelength VCSEL on InP grown by MOCVD", Electronics Letters, Mar. 6, 2003, vol. 39, No. 5.

Ohiso, et al. "1.55-µm Buried-Heterostructure VCSELs With InGaAsP/InP-GaAs/AlAs DBRs on a GaAs Substrate", IEE Journal of Quantum Electronics, vol. 37, No. 9, Sep. 2001, p. 1194-1202.

(Continued)

*Primary Examiner*—James Menefee
(74) *Attorney, Agent, or Firm*—Ronald J. Paglierani; Thomas Cole

(57) ABSTRACT

A method of fabricating an indium phosphide-based vertical cavity surface emitting laser (VCSEL) having a high reflectivity distributed Bragg reflector (DBR) that is particularly adapted for emitting a light having a center wavelength of around 1.30 micrometers. The method includes the steps of selecting a specific operating wavelength, determining the photon energy corresponding to the selected operating wavelength, selecting a maximum operating temperature in degrees Centigrade, and fabricating at least half of the high index layers of the distributed Bragg reflector (DBR) of the VCSEL from AlGaInAs or other material that can be epitaxially grown on the InP substrate to have a band gap equal to or greater than the sum of the photon energy (in millielectron volts) plus the sum of the maximum operating temperature plus 110 divided by 1.96. The manufacture of the high index layers with such a band gap creates a sufficient difference in the indices of refraction of the alternating layers in the DBR, while keeping optical absorption low to maintain the reflectivity at least up to the desired maximum temperature, and obviates the need for using a DBR either bonded to the InP substrate, or grown metamorphically on it.

24 Claims, 4 Drawing Sheets

OTHER PUBLICATIONS

Jayaraman et al. "High-Power 1320-nm Wafer-Bonded VCSELs With Tunnel Junctions" IEEE Photonics Technology Letters, vol. 15, No. 11, Nov. 2003, p. 1495-1497.

Cheng et al. "10Gb/s Transmission Using Efficient 1.31 μm AlInGaAs VCSELs with Good High Temperature Performance", E20 Communications Inc., 3601 Calle Tecate, Camarillo, CA 93012. n.d.

* cited by examiner (Eg=1.016eV)
— 20C
— 85C
— 100C (Eg=1.033eV)
— 20C
— 85C
— 100C 1.33μm VCSEL (Eg=1.008eV) (20-66°C)

1.33μm VCSEL (Eg=1.033eV) (20-125°C)

METHOD OF MANUFACTURING AN INP BASED VERTICAL CAVITY SURFACE EMITTING LASER AND DEVICE PRODUCED THEREFROM

BACKGROUND OF THE INVENTION

1. Field of the Invention

This invention generally concerns surface emitting lasers, and is specifically concerned with a long wavelength, indium phosphide (InP) based vertical cavity surface emitting laser having a high-reflectivity distributed Bragg reflector.

2. Related Background Art

Vertical cavity surface emitting lasers (VCSELs) are well known in the prior art. Generally speaking, a VCSEL is a semiconductor device comprising a lower substrate, a distributed Bragg reflector (DBR), an active layer (or layers) where the lasing occurs, and an upper reflector which may be either another DBR or other type of mirror. Upper and lower electrode layers are also provided in the device. An opening is centrally provided in either the upper or lower electrode layer to admit light out of the device generated by the active layer when an electric voltage is applied across the upper and lower electrode layers.

VCSELs possess many attributes that make them well suited for use in low-cost optical communication networks. The symmetrical, circular beam emitted from the VCSEL structure may be easily coupled to optical fibers. The VCSELs' small size allows them to be densely arrayed along two dimensions on a single semiconductor wafer. Finally, unlike other types of lasers, such as edge emitting lasers, there is no need to mechanically or chemically create a separate, reflecting facet to act as a resonating mirror is integrally grown within the laser in the form of a DBR, which advantageously reduces the manufacturing cost.

While VCSELs for optical networks may be formed from a number of different semiconducting materials, indium phosphide (InP) is preferred, as the range of laser wavelengths generated by such VCSELs (which is between 1.1 and 2.0 microns) encompasses both of the relatively long wavelengths of light presently best transmitted through optical fibers in such networks, i.e., around 1.31 microns and 1.55 microns.

In the past, it has proven particularly difficult to manufacture InP-based VCSELs that are capable of efficiently generating laser radiation having a center wavelength of around 1.3 microns. This problem is caused by the failure of the DBR within the VCSEL to provide the high degree of reflectivity (99.9% desired) necessary to produce an efficient lasing operation. To understand the origin of this problem, some discussion of the structure and function of DBRs is necessary.

DBRs in VCSELs are formed from alternating layers, each of which is one-quarter wavelength thick, of semiconducting materials having different refractive indices. The difference between the refractive indices of the low index layers and the high index layers must be of a certain amount before the DBR becomes sufficiently reflective to perpetuate, within the active area of the VCSEL, an optical resonance that results in an efficient lasing operation. In InP-based VCSELs, it is preferable to form the layers having the lower index of refraction from InP, while forming the layers having the high index of refraction from a semiconducting material having a compatible lattice structure that may be epitaxially grown on the InP layers. The use of such materials in the DBR allows the VCSEL to be grown epitaxially, for example by MBE (Molecular Beam Epitaxy), or MOCVD (Metal Organic Chemical Vapor Deposition). Examples of such materials that may be used as the high index layers include alloys formed from gallium (Ga), arsenic (As), aluminum (Al), antimony (Sb), indium (In) and phosphorus (P), such as AlGaInAs, GaInAsP, and AlGaAsSb. Other combinations of semiconducting materials that may be epitaxially grown over an InP substrate to form alternating high and low index layers for a DBR include AlGaInAs/AlInAs; GaInAsP/AlInAs and AlGaAsSb/AlGaAsSb. In this application, the term "InP-based VCSEL" encompasses all VCSELs grown on an InP substrate and including a DBR formed from any of the aforementioned alternating layers, or any other layers that may be epitaxially grown on an InP substrate.

Unfortunately, it is difficult to attain a large enough difference in the index of refraction between the high and low index layers when the aforementioned alloys are used. Since there is no way to lower the index of the materials forming the low index layers (such as InP or AlInAs), the only way to achieve a larger difference is to make the index of the high index materials higher by adjusting the mole fractions of the elements forming the high index alloy. This has the effect of decreasing the band gap of the high index materials so that it begins to approach the photon energy of the lasing wavelength of the VCSELs. However, the applicants have observed that if the band gap of the high index materials is decreased too close to the photon energy of the lasing wavelength, the resulting reflectivity can actually become worse due to absorption of the laser radiation by the high index materials. The applicants have further observed that if one attempts to avoid the laser radiation absorption problem by lessening the increase in the refractive index of the high index materials, the resulting VCSEL may not perform well over a broad range of temperature. The applicants believe that the fall off in performance is caused by a degradation in reflectivity of the DBR at higher temperatures since the optical absorption spectrum moves toward longer wavelength much faster than the lasing wavelength as the temperature is raised. On the other hand, if the index of the high index materials is not above a certain level, the reflectivity of the resulting DBR will be unacceptably low. Hence, the index of refraction of the high index materials may only be chosen within a narrow range in order to achieve a high-performance VCSEL over a broad range of ambient temperature. Because this narrow range for high performance varies with both the mid-wavelength of the VCSEL and the temperature of the device, up to now there has been no known way to easily and consistently manufacture high-efficiency, InP-based VCSELs.

Because of the difficulty in achieving the optimum amount of difference in the index of refraction in InP type materials, different semi-conducting materials have been used to form the DBRs in the prior art, such as alternating layers of GaAs/Al(Ga)As. Growth of thick layers of (Al) GaAs on InP results in a high density of defects and in morphological imperfections, due to the large difference between the crystal lattice constants of (Al)GaAs and InP. To avoid such defects propagating throughout the structure, a GaAs-based DBR has been mechanically transferred onto the InP-based active region. Unfortunately, such a wafer-bonding technique is difficult, requiring precise mechanical orientation between the GaAs-based DBR and the VCSEL wafers or films. Additionally, the bonding of a large area uniformly, without bubbles, is difficult. The reliability of the resulting VCSELs is easily compromised by an imperfect bonding process. Similar reliability problems are associated with the metamorphic growth of such GaAs-based DBRs onto InP substrates.

Clearly, there is a need for a method of fabricating InP-based VCSELs having DBRs of high reflectivity throughout a broad range of laser wavelengths, and in particular around 1.3 micrometer. Ideally, such a method would obviate the need for separate, wafer bonding steps, or for metamorphic-type growth.

SUMMARY OF THE INVENTION

The invention is a method of manufacturing an InP-based VCSEL that overcomes the aforementioned problems associated with the prior art. In the method of the invention, the specific wavelength of laser light to be generated by the VCSEL is first selected, this wavelength being equivalent to a photon energy $E_{lasing}$ (usually expressed in $meV_S$). Next, the maximum operating temperature $T_{max}$ is selected where $T_{max}$ is expressed in degrees Centigrade, and corresponds to the maximum temperature at which one wants the DBR to maintain high reflectivity. Finally, at least half of the high index layers of the DBR of the VCSEL are fabricated to have a band gap G(meV) equal to or greater than:

$$E_{lasing}(meV) + \frac{T_{max} + 110}{1.96}$$

The provision of high index layers with such a band gap creates a large enough difference between the indices of refraction of the alternating high and low index layers of the DBR, while keeping the optical absorption low so that a high reflectivity is maintained at least up to the desired operating temperature.

At least a majority of the high index layers closer to the active layers of the laser should have a band gap equal to or larger than G. In a preferred method of the invention, $T_{max}$ is selected between about 50° C. and 125° C. The selected operating wavelength is selected between about 1.1 and 2.0 micrometers, and more preferably between about 1.25 and 1.36 micrometers.

The fabrication step includes adjusting the composition of the high index layers of the DBR to achieve the aforementioned band gap. In a preferred method of the invention, the high index layers are formed from an alloy of Ga and As and at least two elements from the group consisting of Al, In, P and Sb, and the band gap is adjusted by altering the mole fractions of the elements forming the alloy.

If the high index layers are $Al_xGa_yIn_{(1-x-y)}As$, their band gaps can be adjusted by modifying their Al and Ga mole fractions, the mole fraction of In being adjusted slightly to keep the lattice constant of those layers equal to that of the InP substrate, which is important for perfect or near-perfect growth of thick structures such as a DBR. When the high index layers are $Ga_xIn_{(1-x)}As_yP_{(1-y)}$, or $Al_xGa_{(1-x)}As_ySb_{(1-y)}$, the mole fractions of all four elements need to be changed in order to adjust the band gap while keeping the lattice constant of those layers equal to that of the InP substrate. In the preferred method, the high and low index layers of the DBR are fabricated by epitaxial growth on top of an InP substrate.

The invention further encompasses a long wavelength, InP-based VCSEL for emitting light having a wavelength between about 1.1 and 1.5 micrometers that comprises an InP substrate, a DBR grown on the substrate and including high and low index layers, and an active lasing section deposited on the DBR, wherein at least half of the high index layers have a band gap G equal to or greater than that defined by the formula in the method of the invention.

DETAILED DESCRIPTION OF THE PREFERRED EMBODIMENT

Figure 1:
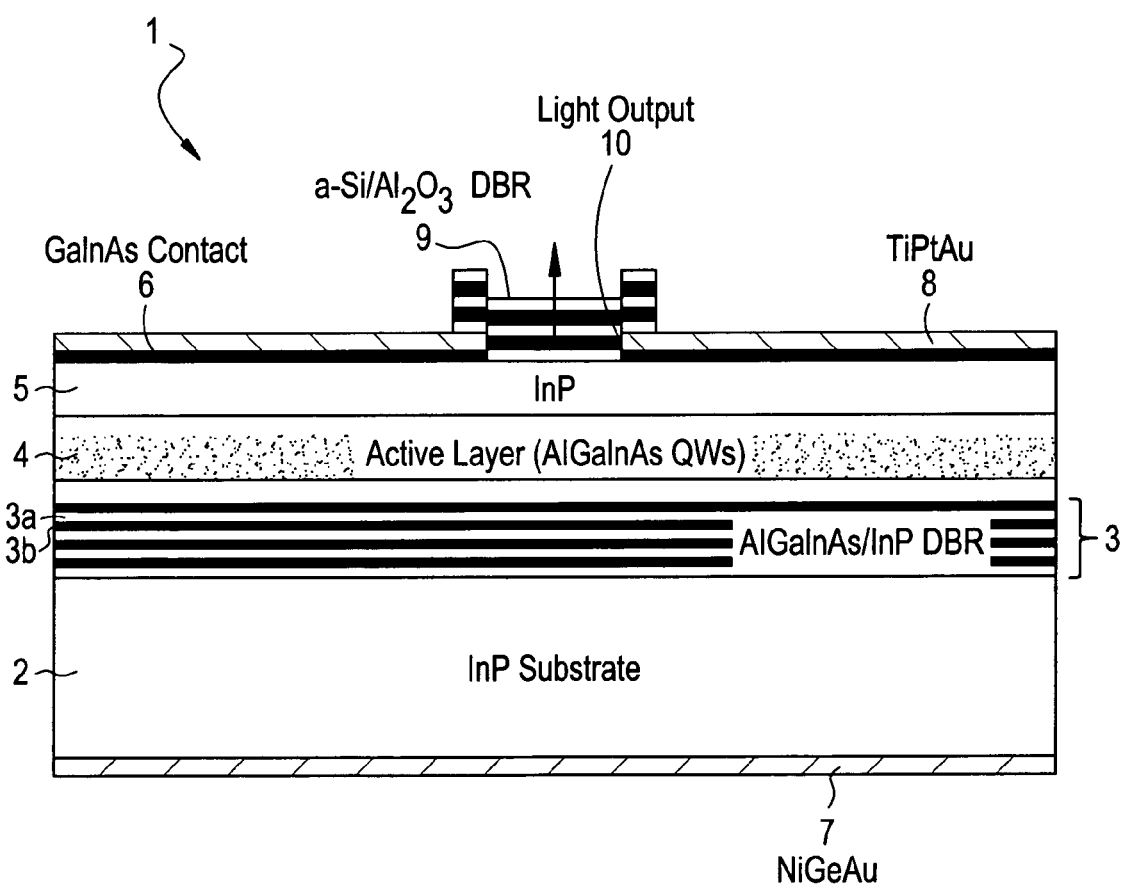
FIG. 1 is a schematic, cross-sectional view of a VCSEL fabricated in accordance with the invention.

FIG. 1 illustrates one of many InP-based VCSEL configurations that the invention is applicable to. In this example, the VCSEL 1 includes, from the bottom up, an InP substrate 2 having a DBR 3 epitaxially grown over it. In this particular example, the DBR 3 includes alternating high and low index layers 3a, 3b formed from AlGaInAs and InP, respectively, each of which is one-quarter wavelength thick. The DBR 3 may have, for example, over forty pairs of such alternating high and low index layers. An active layer 4, deposited over the DBR 3, may be formed from AlGaInAs having different mole fractions of its respective elements compared to the material forming the high index layers. Next, another InP layer 5 is deposited over the active layer 4. A contact layer 6 is deposited over the InP layer 5. This contact layer may be formed, for example, of GaInAs. Electrode layers 7 and 8, formed from corrosion-resistant alloys NiGeAu and TiPtAu, respectively, are deposited on the bottom and top sides of the VCSEL 1 as shown. Finally, an upper DBR 9 is deposited over the top electrode layer 8. The upper DBR 9 may be formed from $Si/Al_2O_3$ or any other highly reflective material which may be easily deposited over a metallic layer. In operation, a voltage is applied across the top and bottom electrode layers 7, 8. The voltage causes electrons to flow toward the holes present in the active layer 4, initiating a lasing operation. The initial laser light generated is then reflected between the lower and upper DBRs 3, 9, creating an optical resonance that induces a full lasing operation. The resulting laser light is emitted out through an opening 10 in the top electrode layer 8.

Figure 2:
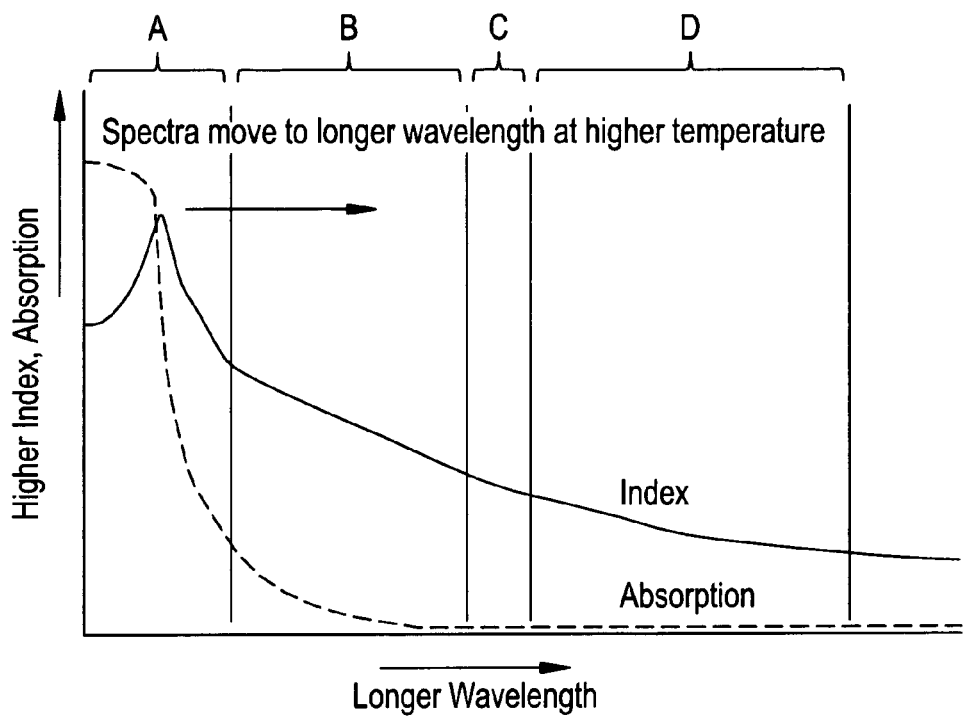
FIG. 2 is a graph illustrating the relationship between increases in the index of refraction of the high index layers of a DBR in a InP-based VCSEL and absorption of the laser light generated by the high index layers.

With reference now to FIG. 2, the present invention stems in part from the applicants' observations regarding the relative amount of laser light absorbed by the high index layers of a DBR in a VCSEL as the index of refraction of these layers is increased. Specifically, if the refractive index of the high-index layers of the DBR is increased such that the band gap of the high index layers begins to approach the photon energy of the lasing wavelength of the VCSELs, as it is in section A of this graph, the absorption of the laser light by the high index layers also begins to increase sharply. In Section A of the graph, the amount of absorption is so great that the resulting reflectivity of the DBR actually becomes worse as the high index of refraction is increased. By contrast, if the bandgap of the high index layers is set to only the range shown in Section B of the graph, the reflectivity of DBR may reach a reasonably high level since the increase in the amount of laser light absorption is substantially smaller than the increase of reflectivity of the DBR. However, if the ambient temperature rises, the absorption of the laser light by the high index layers will increase to an extent that the reflectivity of the DBR is compromised. The applicants believe that such degradation occurs as a result of a displacement of the absorption curve toward the longer wavelength side of the graph due to the shrinkage of the band gap with temperature which in turn causes the portion of the graph in section B to begin to resemble the low-reflectivity portion A of the graph. Portion D of the graph illustrates the case where the index of refraction of the high index layers is too low, and the reflectivity of the DBR is therefore too low to provide high enough reflectivity for an efficient, InP-based VCSEL. This leaves only the relatively small section C of the graph where the index of refraction of the high index layers has been raised sufficiently to create the desired, high-reflectivity DBR, but not so much that the resulting higher absorption of these layers begins to counteract the high-reflectivity advantages. Prior to the invention claimed in this application, there was no known way for a semiconductor manufacturer to quickly and easily manufacture InP-based VCSELs with an epitaxially grown, InP-compatible, DBR that achieved the high-degree of reflectivity required for efficient operation, particularly in the 1.3 micrometer range.

In accordance with the method of the invention, at least half of the high index layers 3a of the DBR of the VCSEL are fabricated to have band gap G (expressed in MeV) equal to or greater than $$E_{lasing}(meV) + \frac{T_{max} + 110}{1.96}$$

From the equation above, the band gap of the index layers needs to be higher than the energy corresponding to the lasing wavelength by at least 99.5 meV if Tmax is set to 85° C.

Figure 3:
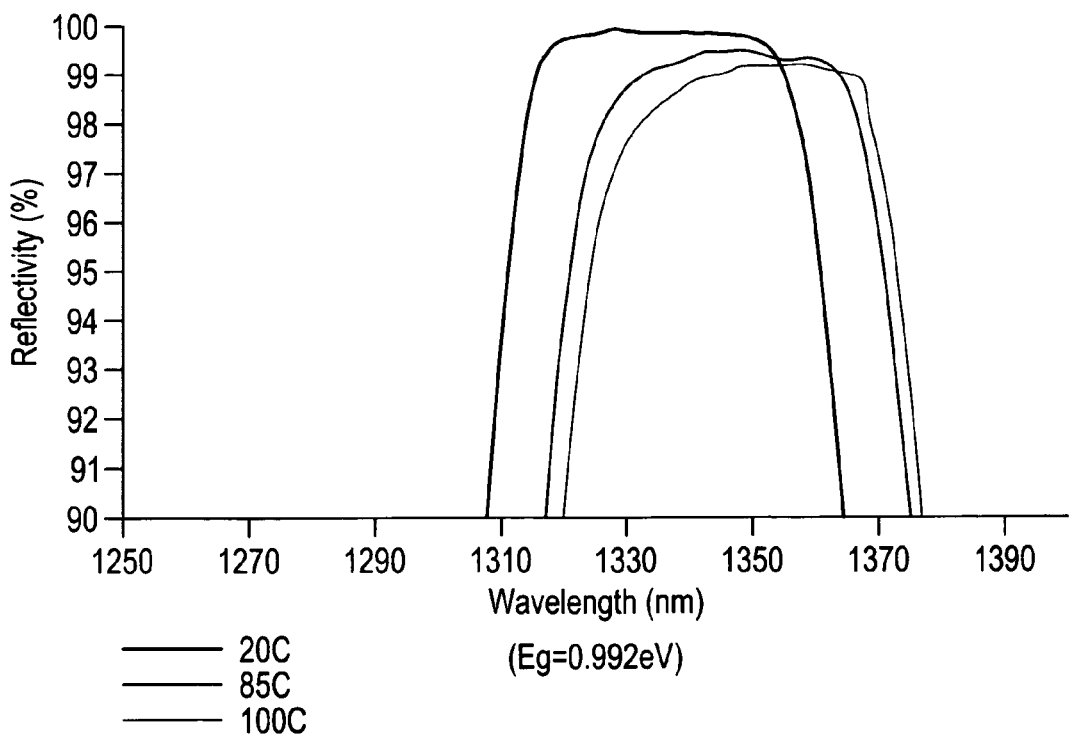
FIGS. 3 and 4 show, for comparison, the reflectivity spectra at 20° C., 85° C. and 100° C. of DBRs having high index layers fabricated with band gaps not in conformance with the invention (not satisfying the equation with Tmax=85° C.) for a center wavelength of 1.33 micrometers.

In FIG. 3 the high index layers of the DBR have a band gap of 0.992 eV, very close to 0.932 eV, which is the energy corresponding to the lasing wavelength of 1.33 micrometers. The separation between the two is only 60 meV (within section B close to section A, see FIG. 2). At 20° C., the reflectivity of the DBR is acceptably high across the approximately 1.29–1.36 micrometer spectrum. However, at 85° C., the peak reflectivity falls off 0.4% from the value at 20° C. Finally, at 100° C., the peak reflectivity of the DBR falls 0.6% from the value at 20° C.

Figure 4:
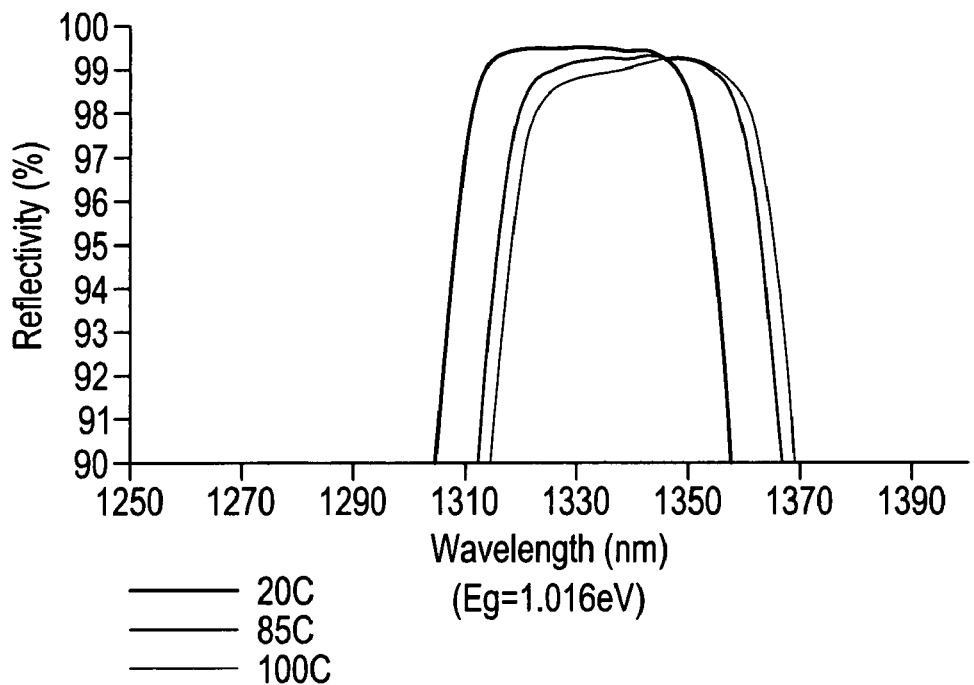

In FIG. 4, the band gap of the high index layers of the DBR is raised to 0.016 eV (G-E$_{lasing}$=84 MeV). Again, at 20° C., the reflectivity performance across the entire spectrum of laser light is reasonably high. However, at 85° C., the peak reflectivity of the spectrum has 0.2% fall from the value at 20° C. Finally, at 100° C., the reflectivity has fallen 0.3% from the value at 20° C. Although this DBR performs better than the DBR in FIG. 3, it is still in section B of FIG. 2.

Figure 5:
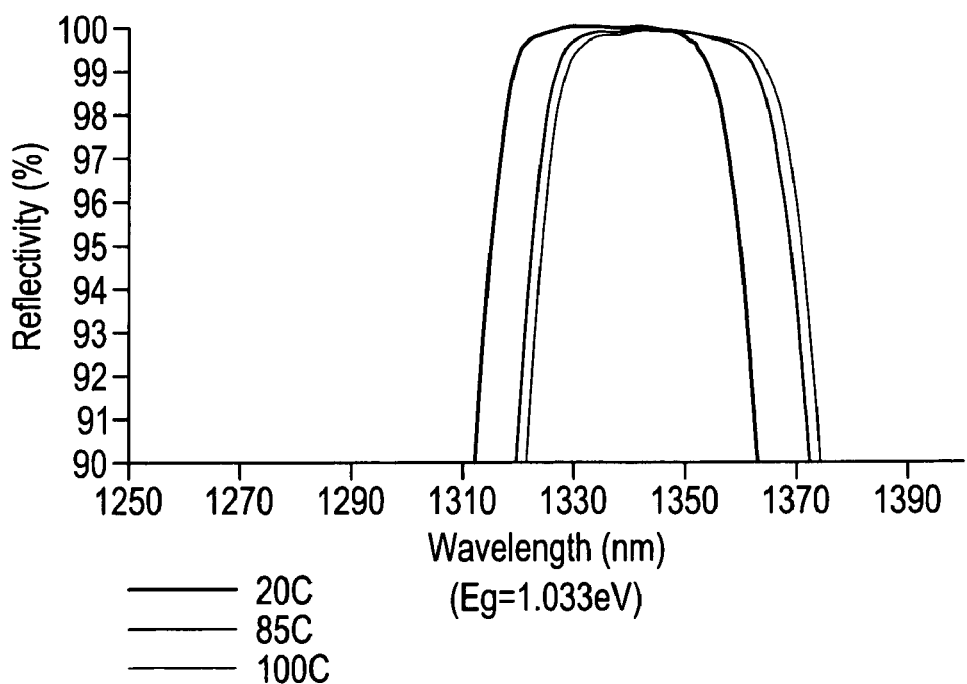
FIG. 5 shows the reflectivity spectra at 20° C., 85° C. and 100° C. of a DBR fabricated in accordance with the invention (satisfying the equation with Tmax=85° C.) for a center wavelength of 1.33 micrometers.

FIG. 5 illustrates the reflectivity spectra of a DBR with the band gap of the high index material equal to 1.033 eV (G-E$_{lasing}$=100 meV), which corresponds to section C of the graph illustrated in FIG. 2 since the band gap satisfies the equation with Tmax=85° C. As is illustrated in FIG. 5, there is virtually no drop off in reflectivity performance across a broad temperature range of between 20° C. and 85° C. However, the spectrum of 100° C. shows a 0.1% drop from the value at 20° C.

In the example of the VCSEL 1 of the invention illustrated in FIG. 1, the low index layers 3b are formed from InP, while the high index layers 3a are formed from AlGaInAs, although the high index layers could also be formed from alloys of gallium (Ga), arsenic (As), aluminum (Al), antimony (Sb), indium (In) and phosphorous (P), such as AlGaInAs, GaInAsP, or AlGaAsSb. Other combinations of semiconducting materials that may be epitaxially grown over the InP substrate 2 to form alternating high and low index layers 3a, 3b for a DBR include AlGaInAs/AlInAs, GAInAsP/AlInAs and AlGaAsSb/AlGaAsSb. The epitaxial deposition of the alternating high and low index layers 3a, 3b may be implemented by, for example, MBE (Molecular Beam Epitaxy) or MOCVD (Metal Organic Chemical Vapor Deposition). In this application, the term "InP-based VCSEL" encompasses all VCSELs grown on an InP substrate having a DBR formed from any other layers that may be epitaxially grown on an InP substrate.

Changing the band gap of the high index layer 3a is accomplished by adjusting the mole fractions of the various elements constituting the high index alloy. In the case of Al$_x$Ga$_y$In$_{(1-x-y)}$As, the band gap can be adjusted by modifying the Al and Ga mole fractions, the mole fraction of In being adjusted slightly to keep the lattice constant of those layers equal to that of the InP substrate, which is important for perfect or near-perfect growth of thick structures such as a DBR. As examples, the Al, Ga and In mole fractions of high index layers in FIGS. 3, 4 and 5 are 0.156, 0.315, 0.529; 0.172, 0.299, 0.529 and 0.183, 0.288, 0.529, respectively. When the high index layers are Ga$_x$In$_{(1-x)}$AsyP$_{(1-y)}$, the mole fractions of Ga and In, as well as of As and P, need to be changed in order to adjust the band gap while keeping the lattice constant of those layers equal to that of the InP substrate. In the preferred method, the high and low index layers of the DBR are fabricated by epitaxial growing on top of an InP substrate.

In the preferred embodiment, each of the high index layers 3 of the DBR is manufactured with a band gap in accordance with the above formula. However, similarly advantageous results may be obtained if the DBR's high index layers 3a closest to the active layers 4 of the VCSEL have the above-defined band gap.

Figure 6:
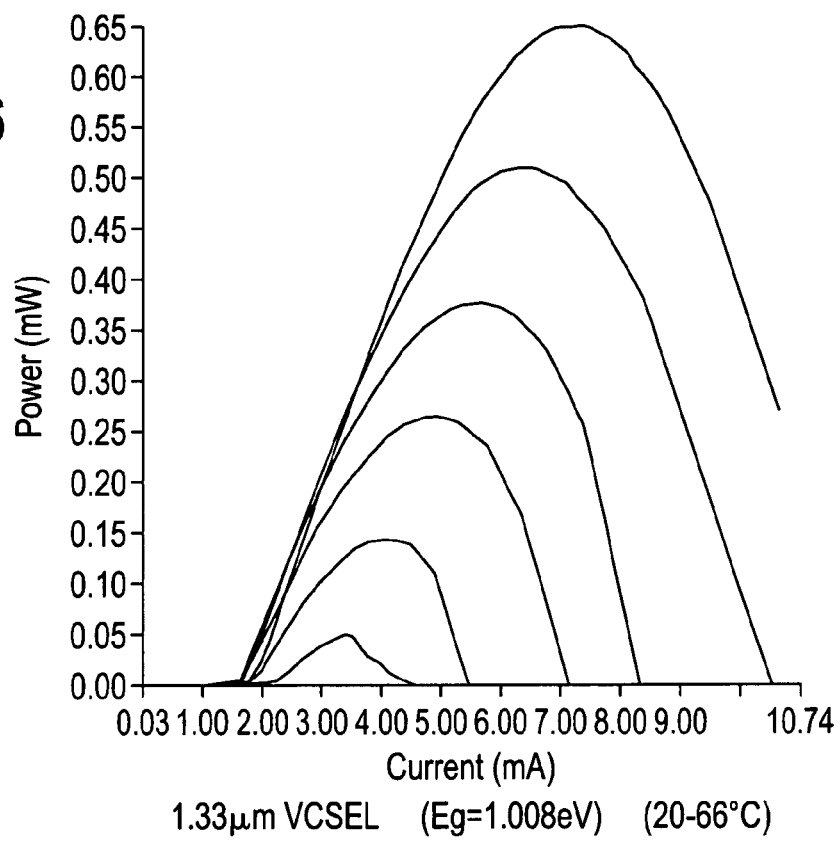
FIG. 6 illustrates the power output versus the current input of a VCSEL having a DBR that is not fabricated in conformance with the invention for temperatures ranging between 20° C. and 66° C.
Figure 7:
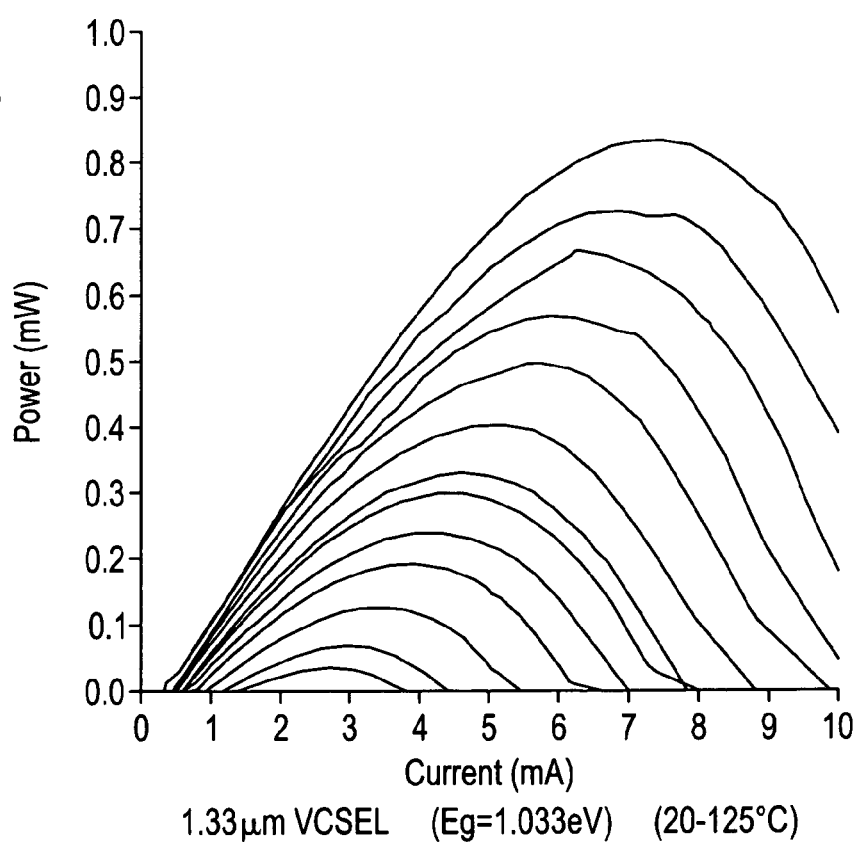
FIG. 7 illustrates the power output versus the current input of a VCSEL having a DBR that is manufactured in conformance with the invention, over a range of temperature between 20° C. and 125° C.

FIGS. 6 and 7 compare the power performance of VCSELs emitting at 1.33 micrometers (photon energy=0.932 eV), and having DBRs not fabricated vs. fabricated in accordance with the invention. In FIG. 6, the band gap of the high index layers of the VCSEL DBR has been adjusted to 1.008 eV, which roughly puts it in the section B portion of the graph illustrated in FIG. 2, and which gives it reflectivity characteristics quite close to those illustrated in FIG. 4. The six graph curves illustrate the power output versus current input for different temperatures between 20° C. and 66° C. FIG. 7 illustrates power output versus current input between 20° C. and 125° C., with each line representing a different temperature, for a VCSEL in which the high index layers of the DBR have a band gap of 1.033 eV, satisfying the equation. As can be seen from a comparison of the two graphs, VCSELs having DBRs constructed in accordance with the invention are capable of efficient lasing operation up to 125° C. Thus, the invention provides InP-based VCSELs which are capable of effectively generating power over a broad temperature range.

While this invention has been described with respect to a preferred embodiment, the invention is applicable to any VCSEL configuration. Various other additions and modifications may be evident to persons of skill in the art. All such additions, modifications and variations are intended to be encompassed within the scope of this patent, which is limited only by the claims appended thereto and their equivalents.

The invention claimed is:

1. A method of manufacturing an InP-based VCSEL having a high reflectively DBR formed from high and low index layers, comprising the steps of:
   selecting an operating wavelength;
   determining the photon energy $E_{lasing}$ corresponding to the selected operating wavelength;
   selecting a maximum operating temperature $T_{max}$, and fabricating at least half of said high index layers to have a band gap G (expressed in meV) equal to or greater than:

$$E_{lasing}(\text{meV}) + \frac{T_{max} + 110}{1.96}.$$

2. The method defined in claim 1, wherein said selected operating wavelength is between about 1.1 and 2.0 micrometers.

3. The method defined in claim 2, wherein said selected operating wavelength is between about 1.25 and 1.36 micrometers.

4. The method defined in claim 1, wherein at least a majority of the high index layers closer to an active region of the laser have a band gap equal to or larger than G.

5. The method defined in claim 1, wherein said $T_{max}$ is selected between about 50° C. and 125° C.

6. The method defined in claim 5, wherein said $T_{max}$ is selected between about 75° C. and 95° C.

7. The method defined in claim 1, wherein said fabrication step includes adjusting the ratio of the elements forming said high index layers to achieve said band gap.

8. The method defined in claim 7, wherein said high index layers are formed from an alloy of Ga and As and at least two from the group consisting of Al, In, P and Sb.

9. The method defined in claim 8, wherein the band gap is achieved by adjusting the mole fractions of elements forming said alloy.

10. The method defined in claim 1, wherein said low index layers include at least two of the group consisting of In, P, Al, As, Ga and Sb.

11. A method of manufacturing a long wavelength, InP-based VCSEL having a high reflectivity DBR formed from alternating high and low index layers, comprising the steps of:
   selecting an operating wavelength of between about 1.1 and 1.5 micrometers;
   determining the photon energy $E_{lasing}$ corresponding to the selected wavelength;
   selecting a maximum operating temperature $T_{max}$ for the laser that is between about 50° C. and 125° C., and fabricating at least a substantial portion of said high index layers to have a band gap (expressed in meV) that is equal to greater than:

$$E_{lasing}(\text{meV}) + \frac{T_{max} + 110}{1.96}.$$

12. The method defined in claim 11, wherein substantially all of said high index layers closer to a light emitting region of the laser have a band gap that is equal to or higher than said defined amount.

13. The method defined in claim 11, wherein said fabrication step includes adjusting the ratio of the elements forming said high index layers to achieve said band gap.

14. The method defined in claim 13, wherein said high index layers are formed from an alloy of Ga and As and at least two from the group consisting of Al, In, P and Sb.

15. The method defined in claim 14, wherein the band gap is adjusted by adjusting the mole fractions of either or both Al and Ga relative to mole fractions of other elements comprising said high index layers.

16. The method defined in claim 11, wherein said low index layers include at least two of the group consisting of In, P, Al, As and Sb.

17. The method defined in claim 11, wherein said DBR is grown epitaxially over an InP substrate.

18. A long wavelength, InP-based VCSEL for emitting light having a wavelength of between about 1.1 and 1.5 micrometers, comprising:
   an InP substrate;
   a DBR supported by said substrate that includes high and low index layers, and
   an active lasing section disposed over said DBR,
   wherein at least half of said high index layers have a band gap G (meV) equal to or greater than:

$$E_{lasing}(meV) + \frac{T_{max} + 110}{1.96}$$

where $T_{max}$ equals a maximum operating temperature of the laser in degrees Centigrade and $E_{lasing}$ is the photon energy of a selected wavelength between 1.1 and 1.5 micrometers.

19. The InP-based VCSEL defined in claim 18, wherein substantially all of said high index layers have said band gap G.

20. The InP-based VCSEL defined in claim 18, wherein an average wavelength of light emitted by said laser is around 1.3 micrometer.

21. The InP-based VCSEL defined in claim 18, wherein $T_{max}$ is selected within the range of between about 50° C. and 125° C.

22. The InP-based VCSEL defined in claim 18, wherein said high index layers are formed from an alloy of Ga and As and at least two from the group consisting of Al, In, P and Sb.

23. The InP-based VCSEL defined in claim 18, wherein said low index layers include at least two of the group consisting of In, P, Al, Ga, As and Sb.

24. The InP based VCSEL laser defined in claim 18, wherein said DBR is grown epitaxially on said substrate.

* * * * *